(12) United States Patent
Evans et al.

(10) Patent No.: US 11,004,648 B2
(45) Date of Patent: May 11, 2021

(54) METHODS AND SYSTEMS FOR MULTI-AREA SELECTIVE ETCHING

(71) Applicant: Applied Materials, Inc., Santa Clara, CA (US)

(72) Inventors: Morgan Evans, Manchester, MA (US); Rutger Meyer Timmerman Thijssen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 9 days.

(21) Appl. No.: 16/290,325

(22) Filed: Mar. 1, 2019

(65) Prior Publication Data

US 2020/0194215 A1 Jun. 18, 2020

Related U.S. Application Data

(60) Provisional application No. 62/780,733, filed on Dec. 17, 2018.

(51) Int. Cl.
*H01J 37/05* (2006.01)
*H01J 37/317* (2006.01)
*H01J 37/147* (2006.01)

(52) U.S. Cl.
CPC .......... *H01J 37/05* (2013.01); *H01J 37/1474* (2013.01); *H01J 37/3171* (2013.01)

(58) Field of Classification Search
CPC ..... H01J 37/05; H01J 37/3171; H01J 37/1474

USPC ........................ 250/492.1–492.3; 204/298.36
See application file for complete search history.

(56) References Cited

U.S. PATENT DOCUMENTS

| | | | |
|---|---|---|---|
| 9,206,500 B2 | 12/2015 | Druz et al. | |
| 2016/0035539 A1* | 2/2016 | Sainiemi | B81C 1/00547 |
| | | | 204/298.36 |
| 2016/0071708 A1 | 3/2016 | Druz et al. | |
| 2016/0259098 A1* | 9/2016 | Sasai | G02B 5/1857 |
| 2018/0267318 A1 | 9/2018 | Levola et al. | |
| 2020/0166681 A1* | 5/2020 | Evans | G02B 5/1819 |

* cited by examiner

*Primary Examiner* — Michael Maskell
(74) *Attorney, Agent, or Firm* — Kacvinsky Daisak Bluni PLLC

(57) ABSTRACT

Embodiments herein provide systems and methods for multi-area selecting etching. In some embodiments, a system may include a plasma source delivering a plurality of angled ion beams to a substrate, the substrate including a plurality of devices. Each of the plurality of devices may include a first angled grating and a second angled grating. The system may further include a plurality of blocking masks positionable between the plasma source and the substrate. A first blocking mask of the plurality of blocking masks may include a first set of openings permitting the angled ion beams to pass therethrough to form the first angled gratings of each of the plurality of devices. A second blocking mask of the plurality of blocking masks may include a second set of openings permitting the angled ion beams to pass therethrough to form the second angled gratings of each of the plurality of devices.

20 Claims, 8 Drawing Sheets

METHODS AND SYSTEMS FOR MULTI-AREA SELECTIVE ETCHING

CROSS-REFERENCE TO RELATED APPLICATION

The present application claims priority to U.S. Provisional Patent Application No. 62/780,733 filed Dec. 17, 2018, entitled "Methods and Systems of Multi-Area Selective Area Etching," and incorporated by reference herein in its entirety.

FIELD

The disclosure relates to optical elements, and more particularly to methods and systems for multi-area selective etching.

BACKGROUND

Optical lenses have long been used to manipulate light for various advantages. Fresnel lenses, for example, are used in lighthouses to bend light from all angles of a point light source into a beam or beams. Fresnel lenses are one particular type of blazed grating. More recently, micro-diffraction gratings have been utilized in holographic and augmented/virtual reality (AR & VR) devices.

One particular AR & VR device is a wearable display system, such as a headset or head mounted display operable to display an image within a short distance from a human eye. The image can be a computer generated image on a display, such as a micro display. The optical components are arranged to transport light of the intended image, generated on the display to the user's eye to make the image visible to the user. The image generated can form part of a light engine, wherein the image itself generates collimated light beams guided by the optical component to provide an image visible to the user.

Different kinds of optical components have been used to convey the image from the display to the human eye. These optical components include lenses, mirrors, optical waveguides, holograms and diffraction gratings, or slanted gratings. Slanted gratings are one particular type of blazed gratings, and may be used for AR & VR systems, such as wearable display systems, displays on mobile devices, etc., wherein the functional design relies on efficient light input and/or output coupling from the grating to the viewer's field of view.

New manufacturing methods require etching slanted gratings of different angles, orientations, and field shapes in high volume on standard industry equipment, at close proximity to each other. Cost and quality of augmented reality glasses are presently limited by current patterning and etch methods, as well as the trend of increasingly smaller devices.

SUMMARY

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

Embodiments of the present disclosure provide a system for generating angled gratings. The system may include a plasma source delivering a plurality of angled ion beams to a substrate, and a plurality of devices formed into the substrate. Each of the plurality of devices may include a first angled grating and a second angled grating. The system may further include a plurality of blocking masks positionable between the plasma source and the substrate. A first blocking mask of the plurality of blocking masks may include a first set of openings permitting the plurality of angled ion beams to pass therethrough to form the first angled gratings of each of the plurality of devices. A second blocking mask of the plurality of blocking masks may include a second set of openings permitting the plurality of angled ion beams to pass therethrough to form the second angled gratings of each of the plurality of devices.

Embodiments of the present disclosure further provide a method for forming an optical element. The method may include providing a plurality of blocking masks between a plasma source and a substrate, the substrate including a plurality of devices, wherein each of the plurality of devices includes a first target area and a second target area. The method may further include delivering, from the plasma source, a plurality of angled ion beams towards the substrate, and receiving the plurality of angled ion beams at one of the plurality of blocking masks. A first blocking mask of the plurality of blocking masks may include a first set of openings permitting the plurality of angled ion beams to pass therethrough to the first target area of each of the plurality of devices. A second blocking mask of the plurality of blocking masks may include a second set of openings permitting the plurality of angled ion beams to pass therethrough to the second target area of each of the plurality of devices.

Embodiments of the present disclosure further provide a system for generating angled gratings, the system including an inductively coupled plasma reactor delivering a plurality of angled ion beams to a substrate, and a plurality of devices coupled to the substrate. Each of the plurality of devices may include a first angled grating and a second angled grating, and a plurality of blocking masks positionable between the plasma source and the substrate. A first blocking mask of the plurality of blocking masks may include a first set of openings permitting the plurality of angled ion beams to pass therethrough to form the first angled gratings of each of the plurality of devices. A second blocking mask of the plurality of blocking masks may include a second set of openings permitting the plurality of angled ion beams to pass therethrough to form the second angled gratings of each of the plurality of devices.

BRIEF DESCRIPTION OF THE DRAWINGS

The accompanying drawings illustrate exemplary approaches of the disclosure, including the practical application of the principles thereof, as follows.

Figure 1:
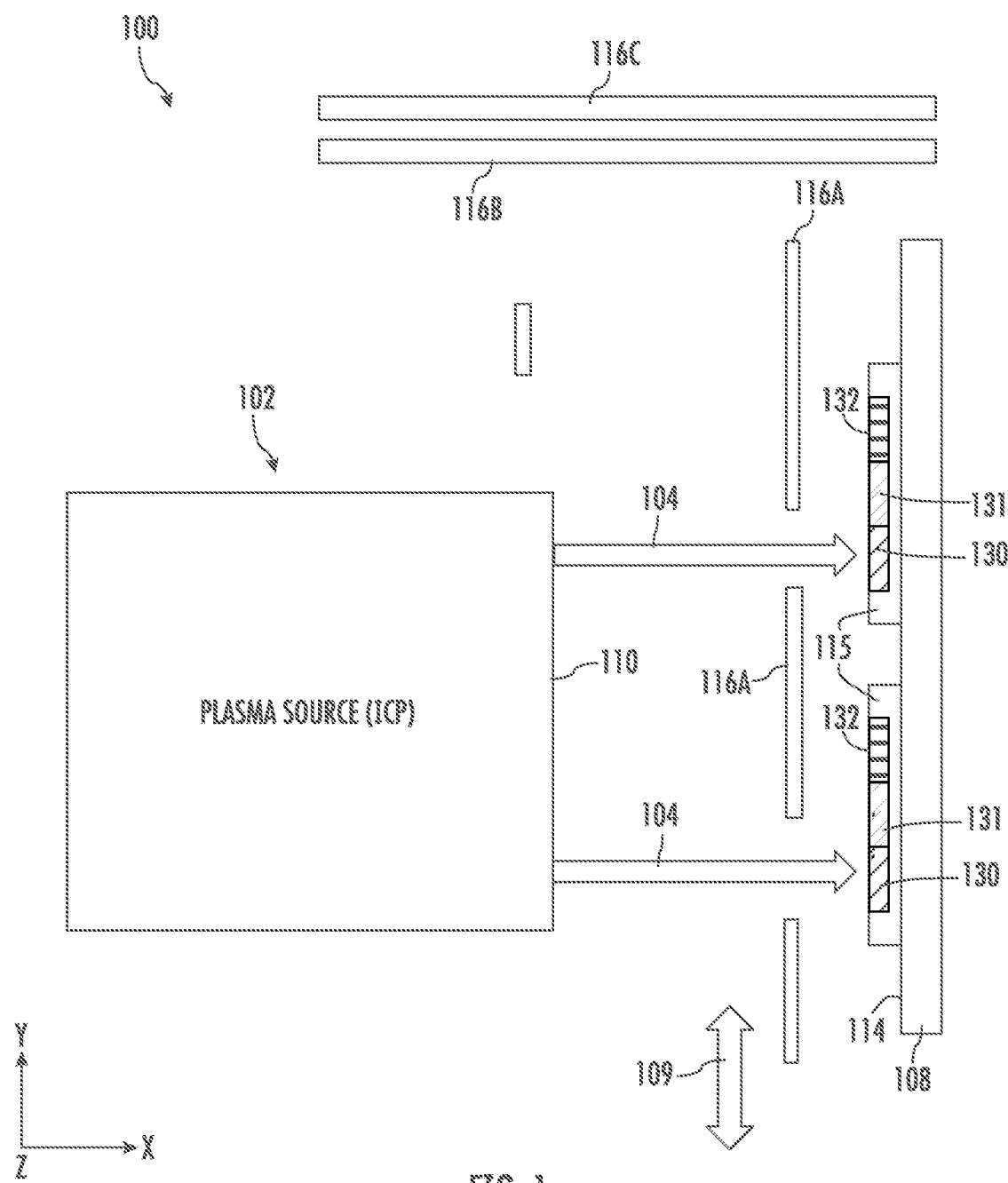
FIG. 1 depicts a system for generating angled gratings on optical components according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so the disclosure will be thorough and complete, and will fully convey the scope of the subject matter to those skilled in the art. In the drawings, like numbers refer to like elements throughout.

Described herein are methods and systems of multi-area selective area etching. A multi-beam system allows for non-uniform/wedge etching to optimize the tradeoff between throughput of large ion beam systems and lateral fidelity of small beam systems. During use, the areas to be wedge etched/SAP'd are aligned to multiple ion beams of small width/height.

FIG. 1 shows part of a system 100 for generating angled gratings on optical components, such as a backlit substrate. As shown, the system 100 may include a plasma source 102 for delivering one or more angled ion beams (hereinafter "beam" or "beams") 104, including reactive radicals, to a wafer or substrate 108 over a substrate scan direction 109. Although not shown, the substrate 108 may be coupled to a tool capable of moving the substrate between load/unload positions, and to rotate the substrate 108. In some embodiments, the plasma source 102 may be an inductively coupled plasma (ICP) reactor operable to form plasmas by inducing current in a process gas disposed within a process chamber via one or more inductive coils (not shown) disposed outside of the process chamber. The inductive coils are often disposed above the chamber and connected to a radio frequency (RF) power source. The plasma source 102 may be at bias potential, while an exit aperture plate 110 may be at substrate potential (ground). Aperture slots (not shown) of the exit aperture plate 110 may be oriented at 45 degrees relative to a first surface 114 of the substrate 108. In alternative embodiments, the substrate 108 may be angled relative to two or more straight-projecting ion beams 104.

As shown, the system 100 may further include a plurality of substrates or devices 115 coupled to the substrate 108. Each of the plurality of devices 115 may include a plurality of varied gratings, such as a first angled grating 130, a second angled grating 131, and a third angled grating 132. To form each of the plurality of varied gratings, the system 100 may include a plurality of blocking masks 116A-C positionable between the plasma source 102 and the substrate 108. In some embodiments, one or more of the blocking masks 116A-C are proximity masks. In other embodiments, one or more of the blocking masks 116A-C may be a thin film deposited on the substrate 108. Although not shown, each of the masks 116A-C may be coupled to any type of device operable to individually move each mask in and out of position between the ion source 102 and the plurality of devices 115. In exemplary embodiments, just one of the masks 116A-C will be impacted by the beams 104 at a given time.

Figure 2:
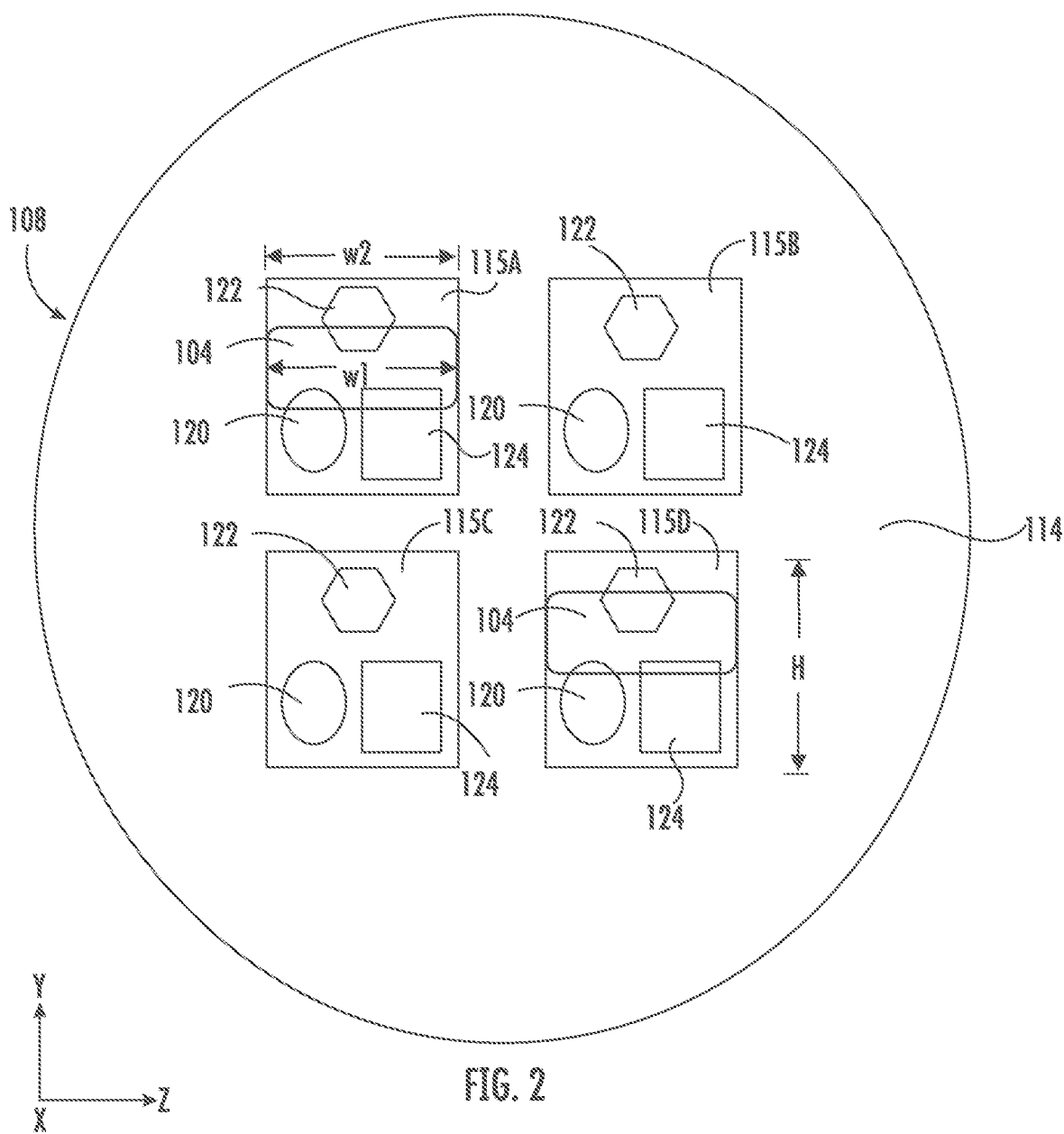
FIG. 2 depicts a plurality of devices on a substrate of the system of FIG. 1 according to embodiments of the present disclosure.

FIG. 2 further demonstrates the substrate 108, and the plurality of devices 115A-D secured to, or formed along, the first surface 114. Although four (4) devices are shown for ease of explanation, a greater number of devices is possible within the scope of the present disclosure. As shown, each of the plurality of devices 115A-D includes a plurality of target areas, such as a first target area 120, a second target area 122, and a third target area 124. As used herein, a "target area" refers to a portion or area of each device 115A-D where a varied grating parameter is desired after treatment by the beams 104. In some embodiments, the beams 104 may each be ribbon beams. In exemplary embodiments, a beam width 'w1' of each beam 104 along the Z-axis may be approximately equal to the width 'w2' of each device 115A-D. More specifically, each beam 104 may have a width not greater than double a width of each of: the first set of openings 148 of the first blocking mask 116A, the second set of openings 150 of the second blocking mask 116B, and the third set of openings 152 of the third blocking mask 116C. In other embodiments, the width 'w1' of the beams 104 may be a few cm wider than each device 115A-D. Furthermore, each of the beams 104 may travel a scan length along the Y-axis approximately equal to a height 'H' of each device 115A-D. In yet other embodiments, the beams 104 may travel a scan length approximately equal to a height of each of: one of the first set of openings 148 of the first blocking mask 116A, one of the second set of openings 150 of the second blocking mask 116B, and one of the third set of openings 152 of the third blocking mask 116C.

Although non-limiting, each of the beams 104 may be approximately 0.1-20 mm wide/high. Furthermore, the total scan length, e.g., along the y-direction, may be less than 100 mm, and preferably less than 20 mm. In some embodiments, etching may be ion sputtering, reactive ion etch, or combinations, such as chemically assisted ion beam etching (CAIBE).

Figure 3:
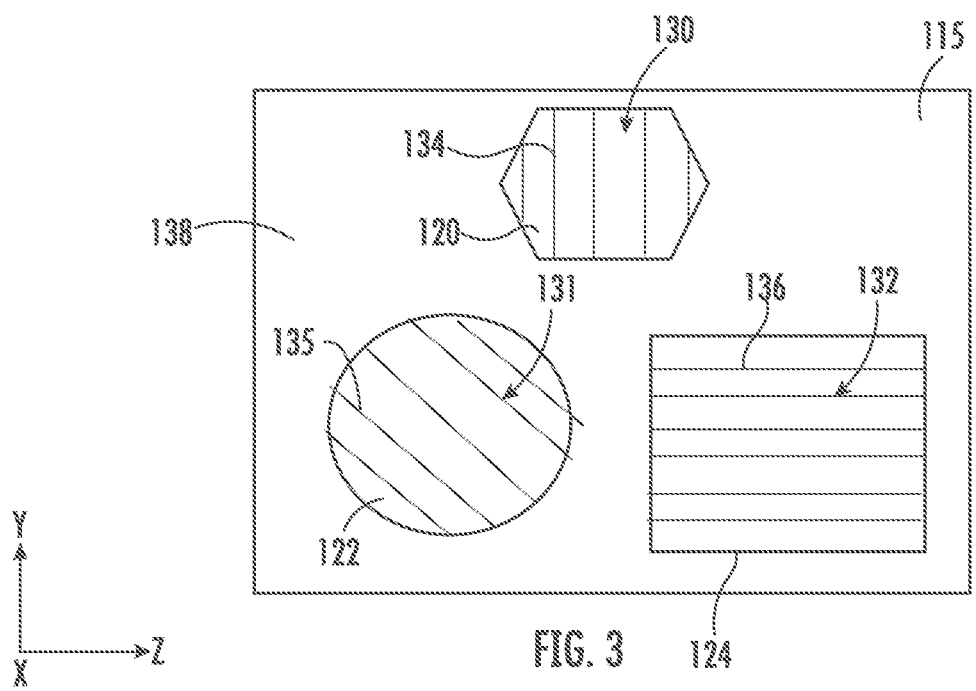
FIG. 3 depicts an example of a device of the system of FIG. 1 according to embodiments of the present disclosure.

FIG. 3 shows an exemplary device 115 according to embodiments of the disclosure in greater detail. The device 115 may be the same or similar to each of the plurality of devices 115A-D shown in FIG. 2. As illustrated, the device 115 may include the first target area 120, the second target area 122, and the third target area 124. After a series of angled etch processes, as will be described below in further detail, a first angled grating 130 may be formed in the first target area 120. Furthermore, a second angled grating 131 may be formed in the second target area 122, and a third angled grating 132 may be formed in the third target area 124. In some embodiments, the first angled grating 130 may include a first plurality of fins 134, the second angled grating 131 may include a second plurality of fins 135, and the third angled grating 132 may include a third plurality of fins 136. Although non-limiting, the first plurality of fins 134 may be oriented parallel to the Y-axis, the second plurality of fins 135 may be oriented at an angle, e.g., 45 degrees, relative to the Z-axis, and the third plurality of fins 136 may be oriented parallel to the Z-axis. As shown, the first angled grating 130, the second angled grating 131, and the third angled grating 132 may be separated by one or more uniform or untreated portions 138 of the device 115. Furthermore, one will appreciate more than three sections of angled grating may be possible in other embodiments.

Figure 4:
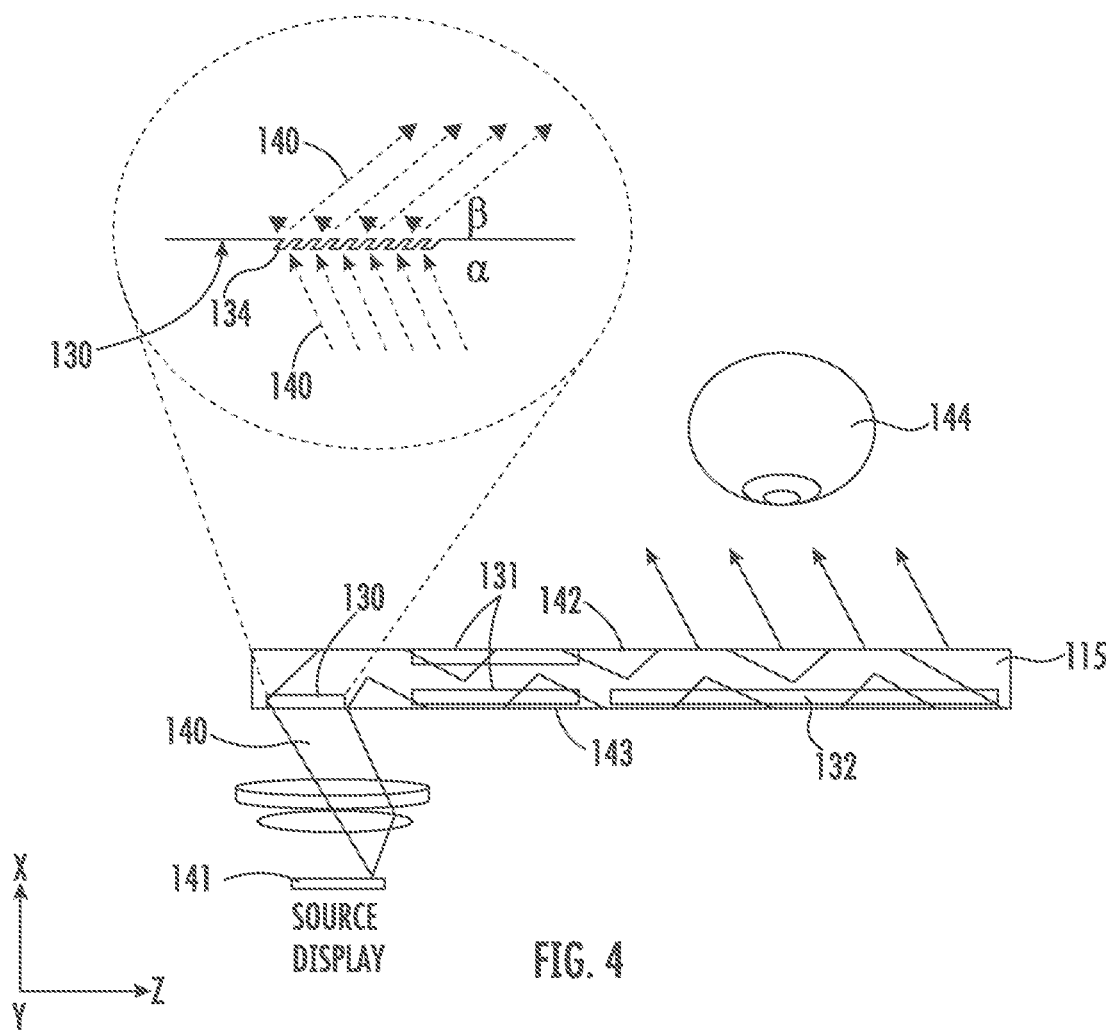
FIG. 4 depicts an example of a device of the system of FIG. 1 according to embodiments of the present disclosure.

FIG. 4 shows the device 115 with greater clarity, including an expanded version showing how a light beam 140 may interact therewith. In the embodiment shown, a source display 141 may provide beams of collimated light, one of the beams of collimated light being shown as the light beam 140. The light beam 140 is reflected within the device 115, between a first surface 142 and a second surface 143. The first angled grating 130 directs the light beam 140 towards the second angled grating 131, and the second angled grating 131 directs the light beam 140 towards the third angled grating 132. As shown, the first plurality of fins 134 of the first angled grating 130 is configured to receive the light beam 140 at a first angle α and then deliver the light beam 140 therefrom at a second angle R. In some embodiments, the third angled grating 132 may be an exit grating, causing diffraction of an image corresponding to the light beam 140 onto a user's eye 144.

Figure 5:
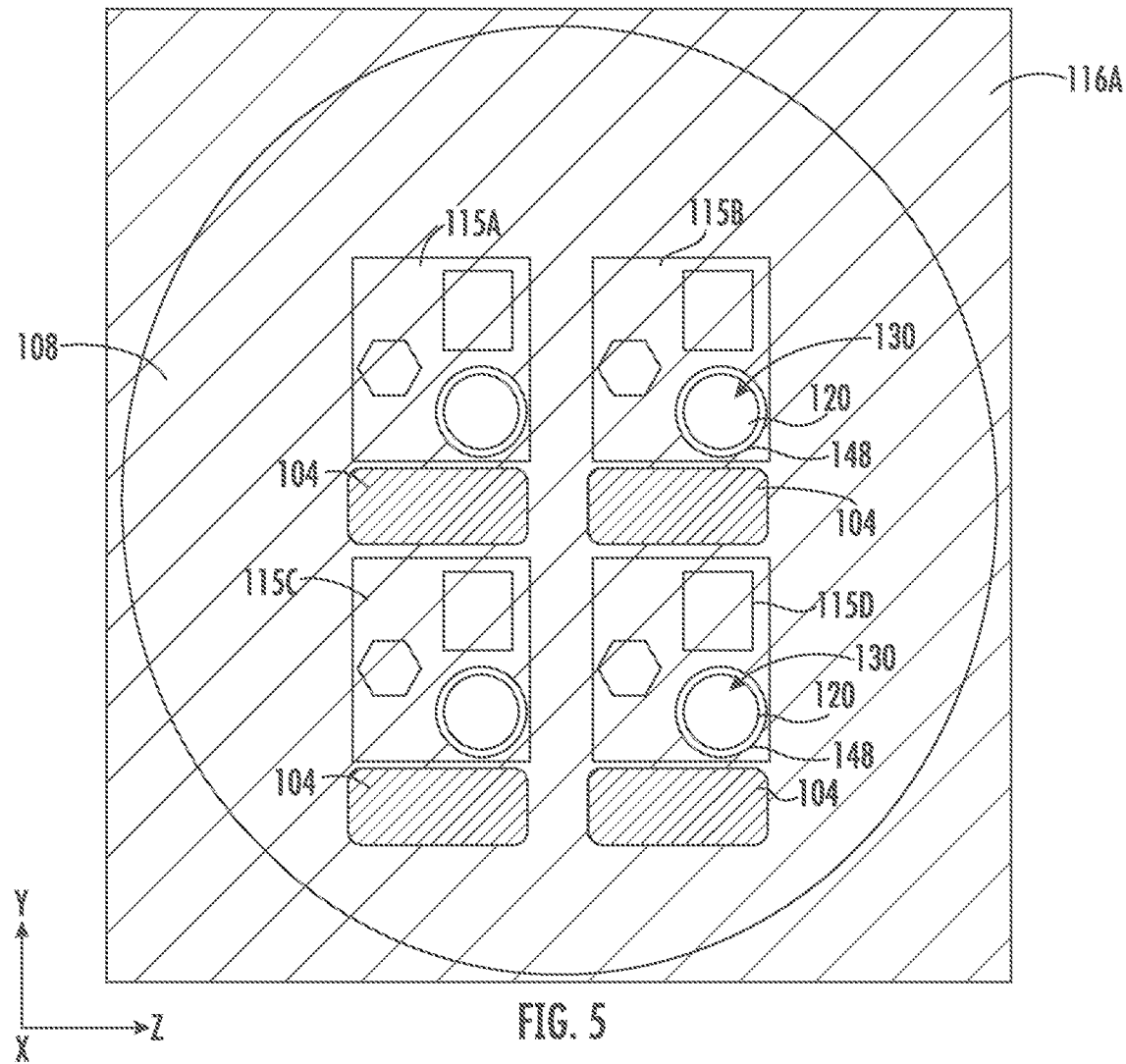
FIG. 5 depicts a first blocking mask disposed over a substrate of the system of FIG. 1 according to embodiments of the present disclosure.

FIG. 5 shows the first blocking mask 116A provided over the substrate 108 for formation of the first angled gratings 130 for each of the plurality of devices 115A-D. The first blocking mask 116A may include a first set of openings 148 permitting the beams 104 to pass therethrough just to each first target area 120. In exemplary embodiments, each of the first set of openings 148 is the same shape/size. The first blocking mask 116A prevents the beams 104 from reaching and impacting all other areas of the devices 115A-D. In some embodiments, the beams 104 are provided to the plurality of devices 115A-D as part of a first process to form the first angled gratings 130 of each of the plurality of devices 115A-D in the first target area 120. In some embodiments, the first process may be an implant or etch process including rotating the first blocking mask 116A and the substrate 108 relative to one another. For example, the first target area 120 may be etched by the beam 104 following a series of 90-degree rotations of the first blocking mask 116A or the substrate 108. A fewer or greater number of rotations is possible within the scope of the present disclosure.

In one example plasma etching process, a plasma of the beams 104 may be formed adjacent the devices 115A-D. Reactive ions and radicals from the plasma react with the surface of the devices 115A-D, removing material therefrom. The rate of material removal, or etching, at a location on the devices 115A-D is generally proportional to the density of reactive species adjacent the location. The process can be repeated multiple times as the first blocking mask 116A or the substrate 108 is rotated to enable fin formation from all sides.

Figure 6:
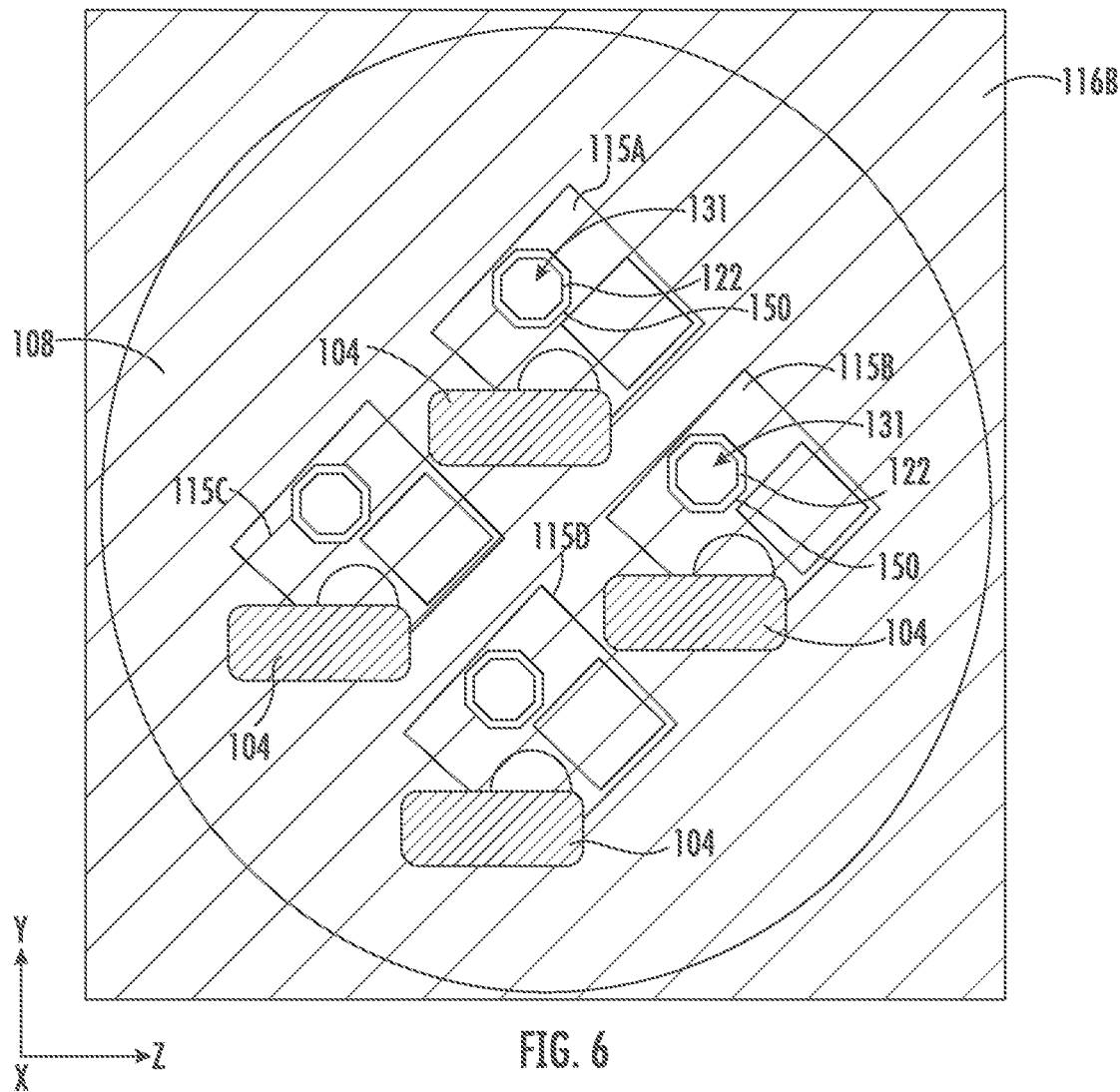
FIG. 6 depicts a second blocking mask disposed over the substrate of the system of FIG. 1 according to embodiments of the present disclosure.

FIG. 6 shows the second blocking mask 116B provided over the substrate 108 for formation of the second angled gratings 131 for each of the plurality of devices 115A-D. The second blocking mask 116B may include a second set of openings 150 permitting the beams 104 to pass therethrough just to each second target area 122. In exemplary embodiments, each of the second set of openings 150 is the same shape/size. The second blocking mask 116B prevents the beams 104 from reaching and impacting all other areas of the devices 115A-D. The beams 104 may be provided to the plurality of devices 115A-D as part of a second process to form the second angled gratings 131 of each of the plurality of devices 115A-D in the second target area 122. In some embodiments, the second process may be an ion implant or etch including rotating the second blocking mask 116B and the substrate 108 relative to one another. For example, the second target area 122 may be etched by the beams 104 following a series of 90-degree rotations of the second blocking mask 116B or the substrate 108. A fewer or greater number of rotations is possible within the scope of the present disclosure.

Figure 7:
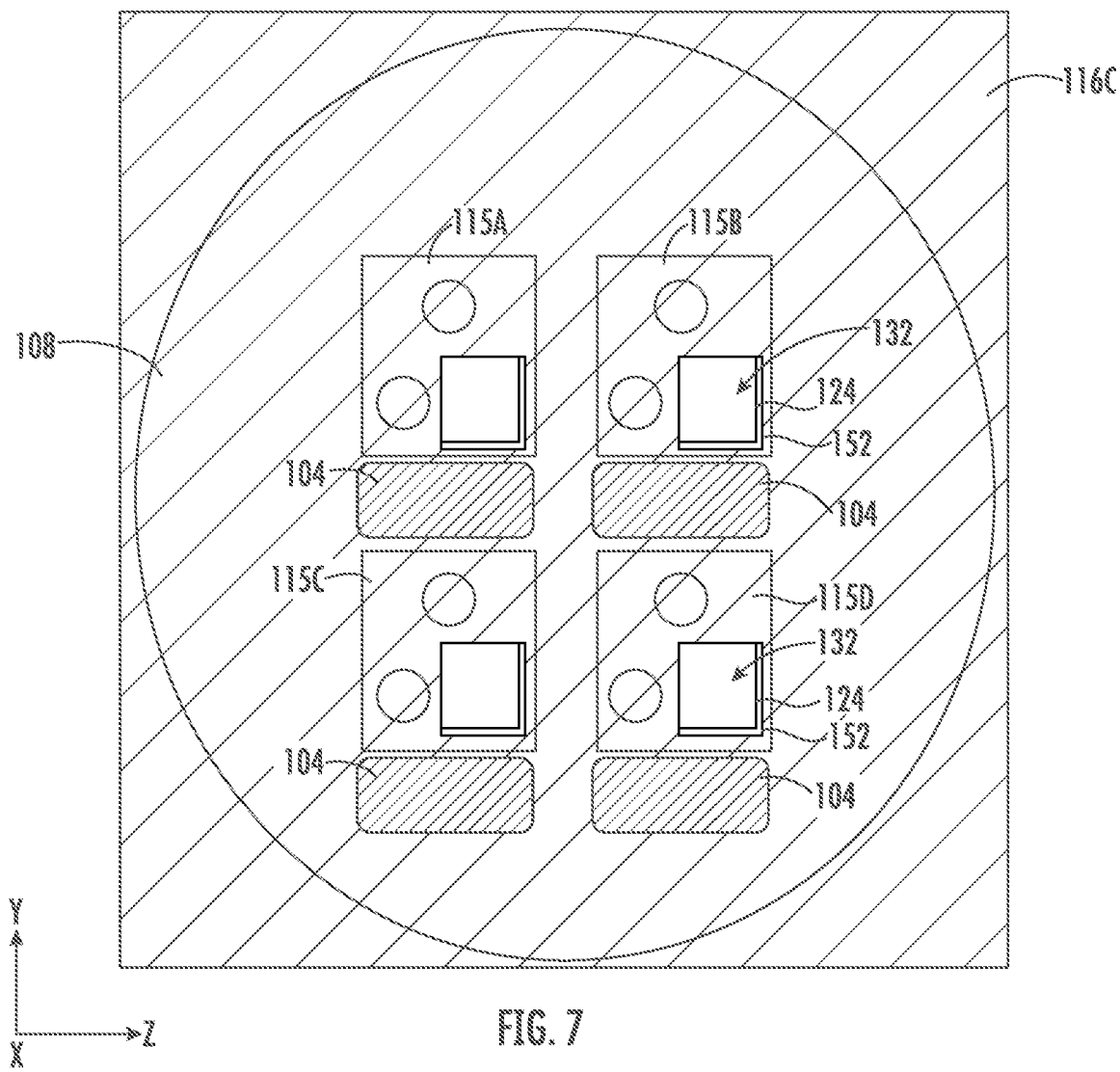
FIG. 7 depicts a third blocking mask disposed over the substrate of FIG. 1 according to embodiments of the present disclosure.

FIG. 7 shows the third blocking mask 116C provided over the substrate 108 for formation of the third angled gratings 132 for each of the plurality of devices 115A-D. The third blocking mask 116C may include a third set of openings 152 permitting the beams 104 to pass therethrough just to each third target area 124. In exemplary embodiments, each of the third set of openings 152 is the same shape/size. The third blocking mask 116C prevents the beams 104 from reaching and impacting all other areas of the devices 115A-D. The beam 104 may be provided to the plurality of devices 115A-D as part of a third process to form the third angled gratings 132 of each of the plurality of devices 115A-D in the third target area 124. In some embodiments, the third process may be an ion implant or etch including rotating the third blocking mask 116C and the substrate 108 relative to one another. For example, the third target area 124 may be etched by the beam 104 following a series of 90-degree rotations of the third blocking mask 116C or the substrate 108. A fewer or greater number of rotations is possible within the scope of the present disclosure.

Figure 8A:
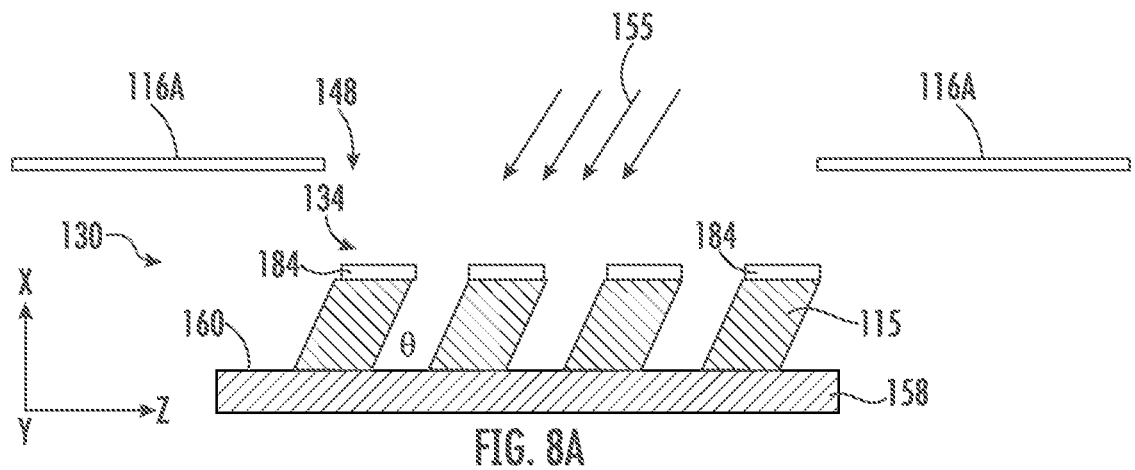
FIGS. 8A-8C depict various slanted grating structures according to embodiments of the present disclosure.
Figure 8B:
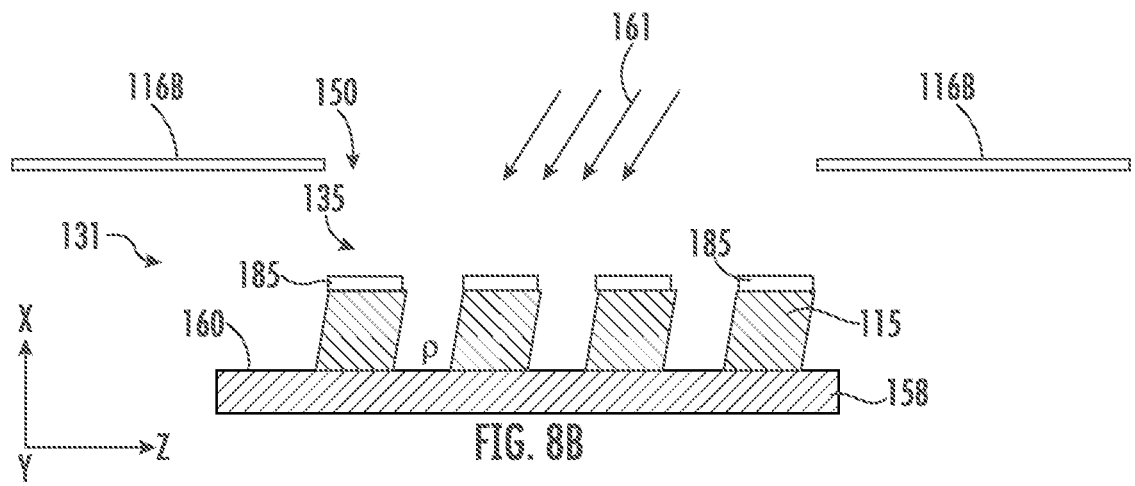
Figure 8C:
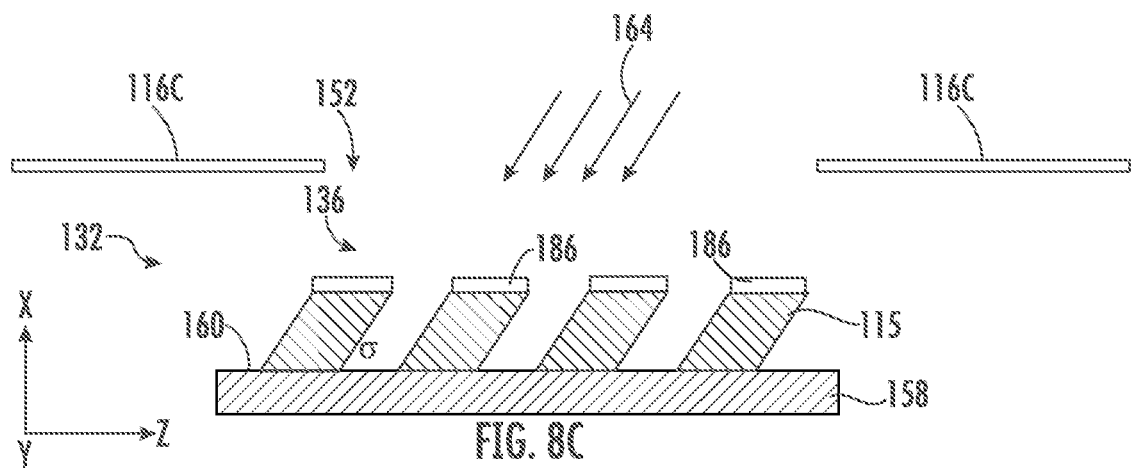

FIGS. 8A-8C show examples of various angled gratings capable of being formed according to embodiments herein. FIG. 8A may represent the first angled grating 130 including the first plurality of fins 134. As shown, the first plurality of fins 134 may be formed from the device 115 using the first etch process, shown as a plurality of angled plasma etch cycles 155 through the first set of openings 148 of the first blocking mask 116A. As shown, the first etch process may be performed with a first hardmask 184 formed atop each of the first plurality of fins 134. Each of the angled plasma etch cycles 155 may be performed after a rotation of the device 115. The first etch process may recess the device 115 to an etch stop layer 158. In some embodiments, the etch stop layer 158 may be a silicon-based compound such as silicon nitride, silicon oxide, silicon oxynitride or silicon oxyfluoride. In other embodiments, the etch stop layer 158 may be titanium nitride. Embodiments herein are not limited to any particular material. As shown, the first etch process forms the first plurality of fins 134 having a first angle θ relative to a base surface 160 of the etch stop layer 158. In some embodiments, the first angle θ is an acute angle.

FIG. 8B may represent the second angled grating 131 including the second plurality of fins 135. As shown, the second plurality of fins 135 may be formed from the device 115 using the second etch process, shown as a plurality of angled plasma etch cycles 161 through the second set of openings 150 of the second blocking mask 116B. As shown, the second etch process may be performed with a second hardmask 185 formed atop each of the second plurality of fins 135. Each of the angled plasma etch cycles 161 may be performed after a rotation of the device 115. The second etch process may recess the device 115 to the etch stop layer 158. As shown, the second etch process forms the second plurality of fins 135 having a second angle ρ relative to the base surface 160 of the etch stop layer 158. In some embodiments, the second angle ρ is an acute angle.

FIG. 8C may represent the third angled grating 132 including the third plurality of fins 136. As shown, the third plurality of fins 136 may be formed from the device 115 using the third etch process, shown as a plurality of angled plasma etch cycles 164 through the third set of openings 152 of the third blocking mask 116C. As shown, the third etch process may be performed with a third hardmask 186 formed atop each of the third plurality of fins 136. Each of the angled plasma etch cycles 164 may be performed after a rotation of the device 115. The third etch process may recess the device 115 to the etch stop layer 158. As shown, the third etch process forms the third plurality of fins 136 having a third angle α relative to the base surface 160 of the etch stop layer 158. In some embodiments, the third angle α is an acute angle. As demonstrated in FIGS. 8A-8C, the first angle θ, the second angle ρ, and the third angle α are different from one another. In other embodiments, the first angle θ, the second angle ρ, and the third angle α are the same or approximately the same.

Figure 9:
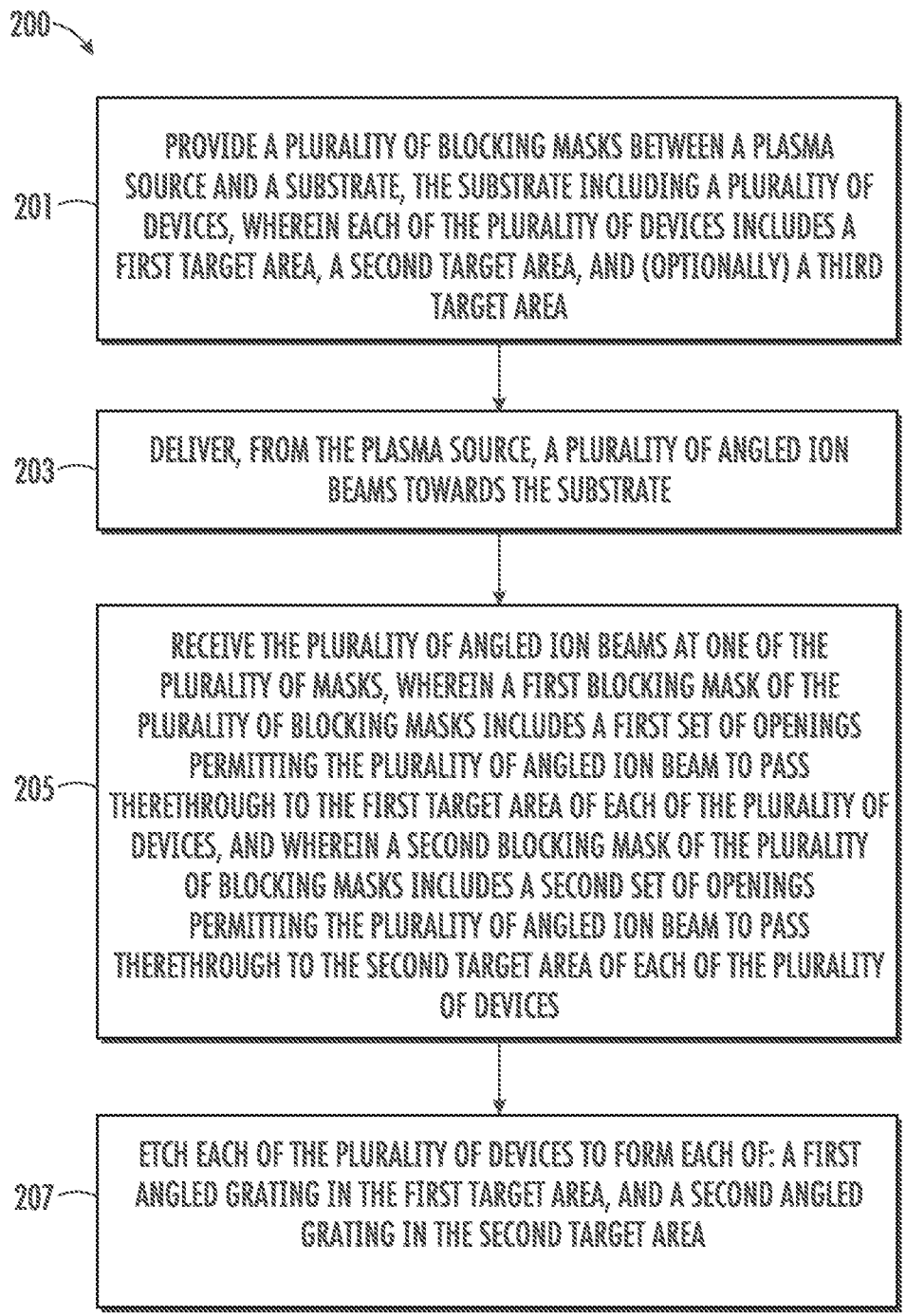
FIG. 9 depicts a method for forming a diffracted optical element having varied gratings in accordance with embodiments of the disclosure.

Turning now to FIG. 9, a method 200 for forming a diffracted optical element having varied gratings according to embodiments of the present disclosure will be described in greater detail. Specifically, at block 201, the method 200 may include providing a plurality of blocking masks between a plasma source and a substrate, the substrate including a plurality of devices secured thereto, wherein each of the plurality of devices includes a first target area and a second target area. In some embodiments, each of the plurality of devices further includes a third target area.

At block 203, the method 200 may further include delivering, from the plasma source, a plurality of angled ion beams towards the substrate. In some embodiments, each of the plurality of angled ion beams is a ribbon beam and reactive radicals for performing an angled ion etch process. In some embodiments, each beam may be approximately 0.1-10 mm "wide"/high. The substrate can be scanned just as far as approximately 1 device to be etched, e.g., <100 mm.

At block 205, the method 200 may include receiving the plurality of angled ion beams at one of the plurality of masks, wherein a first blocking mask of the plurality of blocking masks includes a first set of openings permitting the plurality of angled ion beams to pass therethrough to the first target area of each of the plurality of devices. A second blocking mask of the plurality of blocking masks may include a second set of openings permitting the plurality of angled ion beams to pass therethrough to the second target area of each of the plurality of devices. In some embodiments, the angled ion beam is received at just one blocking mask of the plurality of blocking masks at a time.

At block 207, the method 200 may further include processing (e.g., etching) each of the plurality of devices to form each of: a first angled grating in the first target area, a second angled grating in the second target area, and a third angled grating in the third target area. In some embodiments, at block 207, the method 200 may further include performing a first etch process using the first blocking mask to form the first angled grating, performing a second etch process using the second blocking mask to form the second angled grating, and performing a third etch process using the third blocking mask to form the third angled grating. In some embodiments, the first etch process includes rotating the first blocking mask and the substrate relative to one another. The second etch process may include rotating the second blocking mask and the substrate relative to one another, and the third etch process may include rotating the third blocking mask and the substrate relative to one another.

In some embodiments, the first etch process, the second etch process, and the third etch process are performed consecutively while the substrate remains fixed to a substrate holder. In some embodiments, the first, second, and third etch processes are capable of controlling or modifying any of the following grating parameters of the first, second, and/or third angled gratings: pitch, hardmask thickness, fin height, fin thickness (CD), corner radius, over-etch into the etch stop layer, heeling, and footing.

In some embodiments, the first angled grating includes a first plurality of fins formed at a first angle relative to a base surface of each of the plurality of devices, and the second angled grating includes a second plurality of fins formed at a second angle relative to the base surface of each of the plurality of devices. The third angled grating may include a third plurality of fins formed at a third angle relative to the base surface of each of the plurality of devices. In some embodiments, the first angle, the second angle, and the third angle are different from one another. In some embodiments, the first angle, the second angle, and the third angle are each acute.

Although the illustrative method 200 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure. Furthermore, the method 200 may be implemented in association with the formation and/or processing of structures illustrated and described herein as well as in association with other structures not illustrated.

For the sake of convenience and clarity, terms such as "top," "bottom," "upper," "lower," "vertical," "horizontal," "lateral," and "longitudinal" used herein describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In sum, various embodiments described herein provide approaches for forming various optically efficient grating shapes such as slanted gratings for light coupling (e.g., extraction or input) from a backlit substrate. Manufacturing may be accomplished by direct application of the angled ions on the substrate, or on a mask used to transfer the pattern to the substrate of interest. A first technical advantage of the present embodiments includes the use of multiple blocking masks to eliminate the need for lithography masking of various areas of the substrate, thus resulting in more efficient manufacturing. A second technical advantage of the present disclosure includes providing an angled etched with various angles, depths, and locations without removing the substrate from the tool, thus resulting in more efficient manufacturing. A third technical advantage of the present embodiments includes the use of multiple ion beams for a same substrate to increase throughput while also maintaining fidelity. Instead of a one large beam scanned a distance greater than, e.g., 300 mm, each of the multiple ion beams is scanned a distance of approximately 10-20 mm.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A system for generating angled gratings, the system comprising:
   a plasma source delivering a plurality of angled ion beams to a substrate;
   a plurality of devices coupled to the substrate, the plurality of devices including a first angled grating and a second angled grating; and
   a plurality of blocking masks positionable between the plasma source and the substrate, wherein a first blocking mask of the plurality of blocking masks includes a first set of openings permitting the plurality of angled ion beams to pass therethrough to form the first angled grating of the plurality of devices, and wherein a second blocking mask of the plurality of blocking masks includes a second set of openings permitting the plurality of angled ion beams to pass therethrough to form the second angled grating of the plurality of devices.

2. The system of claim 1, wherein the plurality of devices further includes a third angled grating, and wherein a third blocking mask of the plurality of blocking masks includes a third set of openings permitting the plurality of angled ion beams to pass therethrough to form the third angled grating of the plurality of devices.

3. The system of claim 2, wherein the plurality of angled ion beams impacts just one blocking mask of the plurality of blocking masks at a time.

4. The system of claim 2, wherein the first angled grating includes a first plurality of fins forming a first angle relative to a base surface of the plurality of devices, wherein the second angled grating includes a second plurality of fins forming a second angle relative to the base surface of the plurality of devices, wherein the third angled grating includes a third plurality of fins forming a third angle relative to the base surface of the plurality of devices, and wherein the first angle, the second angle, and the third angle are different from one another.

5. The system of claim 1, wherein each ion beam of the plurality of angled ion beams has a width approximately equal to a width of each of the plurality of devices.

6. The system of claim 1, wherein each ion beam of the plurality of angled ion beams has a scan length equal to a height of each of the plurality of devices.

7. The system of claim 1, wherein each ion beam of the plurality of angled ion beams has a scan length equal to one of: one of the first set of openings, and one of the second set of openings.

8. A method of forming an optical element, the method comprising:
   providing a plurality of blocking masks between a plasma source and a substrate, the substrate including a plurality of devices secured thereto, wherein the plurality of devices includes a first target area and a second target area;
   delivering, from the plasma source, a plurality of angled ion beams towards the substrate; and
   receiving the plurality of angled ion beams at one of the plurality of blocking masks, wherein a first blocking mask of the plurality of blocking masks includes a first set of openings permitting the plurality of angled ion beams to pass therethrough to the first target area of the plurality of devices, and wherein a second blocking mask of the plurality of blocking masks includes a second set of openings permitting the plurality of angled ion beams to pass therethrough to the second target area of the plurality of devices.

9. The method of claim 8, wherein a third blocking mask of the plurality of blocking masks includes a third set of openings permitting the plurality of angled ion beams to pass therethrough to a third target area of the plurality of devices.

10. The method of claim 9, further comprising etching the plurality of devices to form the following: a first angled grating in the first target area, a second angled grating in the second target area, and a third angled grating in the third target area.

11. The method of claim 10, further comprising performing a first process using the first blocking mask to form the first angled grating, performing a second process using the second blocking mask to form the second angled grating, and performing a third process using the third blocking mask to form the third angled grating.

12. The method of claim 11, wherein the first process includes rotating the first blocking mask and the substrate relative to one another, wherein the second process includes rotating the second blocking mask and the substrate relative to one another, and wherein the third process includes rotating the third blocking mask and the substrate relative to one another.

13. The method of claim 11, further comprising forming a first plurality of fins at a first angle relative to a base surface of the plurality of devices, forming a second plurality of fins at a second angle relative to the base surface of the plurality of devices, and forming a third plurality of fins at a third angle relative to the base surface of the plurality of devices, and wherein the first angle, the second angle, and the third angle are different from one another.

14. The method of claim 10, wherein the etching comprises at least one of: ion sputtering, reactive ion etching, and chemically assisted ion beam etching.

15. The method of claim 8, further comprising receiving the plurality of angled ion beams at just one blocking mask of the plurality of blocking masks at a time.

16. The method of claim 8, further comprising providing each ion beam of the plurality of angled ion beams with a width equal to a width of one device of the plurality of devices.

17. The method of claim 8, further comprising scanning each ion beam of the plurality of angled ion beams a scan length equal to the first target area or the second target area.

18. A system for generating angled gratings, the system comprising:
    an inductively coupled plasma reactor delivering a plurality of angled ion beams to a substrate;
    a plurality of devices coupled to the substrate, the plurality of devices including a first angled grating and a second angled grating; and
    a plurality of blocking masks positionable between the inductively coupled plasma reactor and the substrate, wherein a first blocking mask of the plurality of blocking masks includes a first set of openings permitting the plurality of angled ion beams to pass therethrough to form the first angled grating of the plurality of devices, and wherein a second blocking mask of the plurality of blocking masks includes a second set of openings permitting the plurality of angled ion beams to pass therethrough to form the second angled grating of the plurality of devices.

19. The system of claim 18, wherein each ion beam of the plurality of angled ion beams has a width equal to a width of each of the plurality of devices, and wherein each ion beam of the plurality of angled ion beams has a scan length approximately equal to a height of each of the plurality of devices.

20. The system of claim 18, wherein each ion beam of the plurality of angled ion beams has a scan length equal to one of: one of the first set of openings, and one of the second set of openings.

* * * * *